United States Patent [19]

D'Augustine

[11] Patent Number: 4,521,501

[45] Date of Patent: Jun. 4, 1985

[54] METHOD FOR REDUCING DEGRADATION OF AN OPTICAL IMAGE IN AN EXPOSURE LIGHTHOUSE

[75] Inventor: Frank T. D'Augustine, Lancaster, Pa.

[73] Assignee: RCA Corporation, Princeton, N.J.

[21] Appl. No.: 513,399

[22] Filed: Jul. 14, 1983

[51] Int. Cl.³ .................................................. G03C 5/04
[52] U.S. Cl. ...................................... 430/24; 430/397; 354/1
[58] Field of Search ........................ 430/24, 397; 354/1

[56] References Cited

U.S. PATENT DOCUMENTS

| | | | |
|---|---|---|---|
| 3,592,112 | 7/1971 | Frey | 95/1 R |
| 3,782,253 | 1/1974 | Van Hekken | 95/1 R |
| 3,783,754 | 1/1974 | Takemoto et al. | 95/1 R |
| 4,013,467 | 3/1977 | Hosokoshi et al. | 96/36.1 |
| 4,157,215 | 6/1979 | Hanak | 430/24 |
| 4,408,851 | 10/1983 | Chase et al. | 430/24 |

*Primary Examiner*—Won H. Louie
*Attorney, Agent, or Firm*—Eugene M. Whitacre; Dennis H. Irlbeck; LeRoy Greenspan

[57] ABSTRACT

In the novel method, light passes upwardly from a light source, through an optical element and then is incident upon a photosensitive layer. A transparent optically-neutral sheet, which may be of glass or plastic, closely spaced above the optical element intercepts extraneous matter that would normally fall on the optical element. At least during the exposing step, the sheet is moved with respect to the optical element to wash out degrading effects of the intercepted material.

11 Claims, 3 Drawing Figures

METHOD FOR REDUCING DEGRADATION OF AN OPTICAL IMAGE IN AN EXPOSURE LIGHTHOUSE

BACKGROUND OF THE DISCLOSURE

This invention relates to a novel method for reducing the degradation of an optical image in an exposure lighthouse. The method is particularly advantageous in preparing a viewing-screen structure for a CRT (cathode-ray tube), such as a color television picture tube, a display tube for an electronic information display, or the like.

Viewing-screen structures, such as black matrices or mosaic luminescent screens for use in cathode-ray tubes, have been made previously by photographic processes. A common process is carried out in an exposure lighthouse in which light from a light source, such as a high-pressure mercury vapor lamp, passes upwardly through one or more optical elements and a photographic master, which may be the apertured mask of the tube, and then is incident upon a photosensitive coating or layer on the inner surface of the viewing window of the tube, which window serves as a support for the layer. The light passing through the photographic master produces a light image, which exposes the photosensitive layer producing an image, corresponding to the light image, of exposed material that is either more or less soluble than the unexposed and underexposed areas, depending upon whether the material of the light-sensitive layer is positive acting or negative acting. In either case, the more-soluble portions of the exposed layer are removed during the subsequent development step.

It is desirable that the screen structure is a faithful replicate of the master, and efforts are made towards reducing as well as preventing the degradation of the optical image. Although the ambient atmosphere is conditioned to remove particles, the optical elements of the lighthouse must be cleaned frequently, as by flushing with compressed air or by brushing, to remove particles that deposit from the ambient atmosphere.

Also, it has been noted that liquid droplets also deposit on the optical elements. Some of the droplets appear to be the perspiration and/or saliva of the operators who load and unload the lighthouse. Such droplets dry on the surface of the optical element and then are difficult or impossible to remove by air flushing, brushing or even washing and/or wiping. The dry droplets degrade the light image by attenuating, refracting and/or diffracting local portions of the light image. The novel method reduces these degrading effects.

SUMMARY OF THE INVENTION

In the novel method for exposing a layer of photosensitive material, light passes upwardly from a light source through an optical element and then is incident on the photosensitive layer as in prior methods. A sheet of optically-transparent, optically-neutral material, such as a glass plate or a plastic sheet, is positioned above the optical element. The sheet intercepts extraneous material that would normally fall on the optical element. At least during the exposing step, the sheet is moved with respect to the optical element in a direction having a substantial component transverse to the upwardly-passing light. The movement of the sheet distributes the degrading optical effects of material intercepted by the sheet. To a large extent the distributed effects are below the threshold of response of the photosensitive layer, and therefore these effects are not seen in the developed layer.

DETAILED DESCRIPTION OF THE PREFERRED EMBODIMENTS

Figure 1:
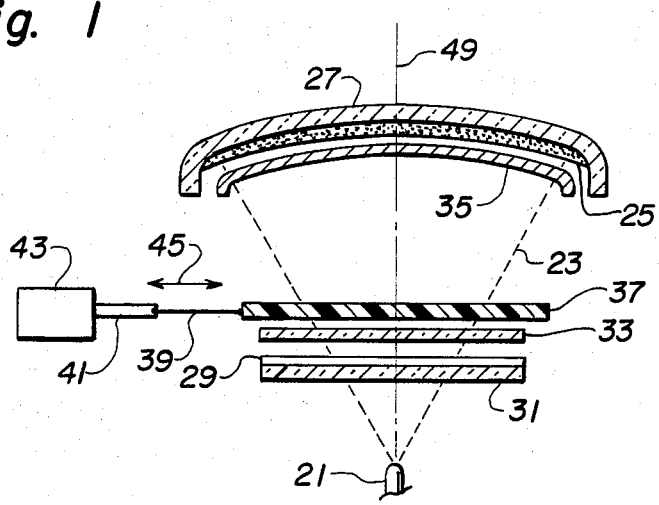
FIG. 1 is a schematic sectional elevational view of portions of a first exposure lighthouse employing an oscillating glass plate according to a first embodiment of the novel method.

A first embodiment of the novel method is described with respect to the first exposure lighthouse shown schematically in FIG. 1. The first lighthouse includes a light source 21 which emits light in a field 23 towards a light-sensitive layer 25 supported on the inner surface of a faceplate panel 27 of a CRT. The light field 23 passes upwardly through an IC (intensity correcting) filter 29 on a glass support 31, through a correction lens 33, which is an optical refractor, then through a photographic master 35, which in this embodiment is the apertured mask of the CRT mounted in the panel 27, and then incident on the photosensitive layer 25. A clear optically-neutral auxiliary glass plate 37, for example, a ground or flat glass plate about 1.59-mm (1/16-inch) thick, is movably positioned in the path of the light field 23 above and closely spaced from the upper surface of the lens 33. The auxiliary glass plate 37 is connected by a linkage 39 to the piston rod 41 of a pneumatic cylinder 43, which moves the auxiliary glass plate 37 back and forth as indicated by the arrow 45 in a direction that is transverse to the upward passage of the light field 23, at least while the coating 25 is being exposed. Particles or droplets in the ambient atmosphere that would normally fall on the lens 33 are intercepted by the upper surface of the auxiliary glass plate 37. The movement of the glass plate, which may travel a distance of about 7 centimeters in each direction every 30 seconds, washes out most of the adverse optical effects of the intercepted material. The auxiliary glass plate 37 is a relatively-cheap item that can be easily and quickly removed, washed, dried and returned to the lighthouse.

Figure 2:
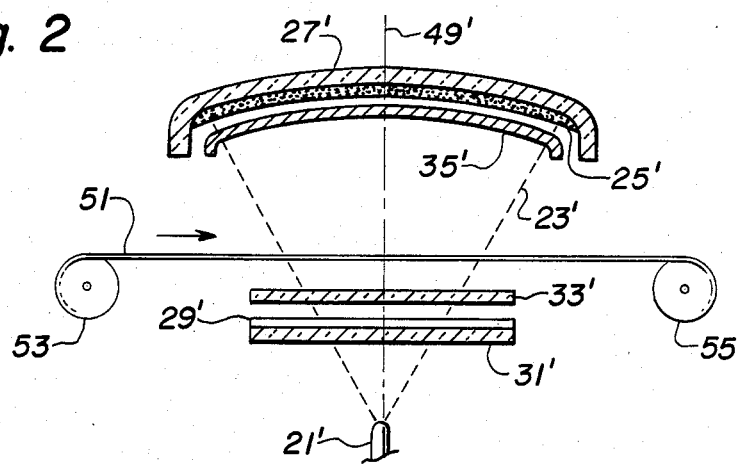
FIG. 2 is a schematic sectional elevational view of portions of a second exposure lighthouse employing a linearly-moving plastic sheet according to a second embodiment of the novel method.

A second embodiment of the novel method is described with respect to the second exposure lighthouse shown in FIG. 2. Except for the means for intercepting extraneous material, the structure is identical to the first exposure lighthouse, and similar reference numerals are used. Instead of an auxiliary glass plate and means for moving that plate as shown in FIG. 1, FIG. 2 shows a sheet 51 of clear transparent plastic, such as a polyester, about 0.025- to 0.125-mm (1- to 5-mils) thick movably positioned above and closely spaced from the upper surface of the lens 33'. The sheet 51 moves continuously, at least while the coating 25' is being exposed, at about 5 centimeters per minute by unwinding from a supply roll 53 and rewinding on a take-up roll 55. The plastic sheet 51 intercepts particles and droplets that would normally fall on the lens 33', and the movement of the sheet 51 washes out most of the adverse optical effects of the intercepted material. The plastic sheet 51 is intended for a single use, and no washing or cleaning is involved. Because of its dielectric character, the plastic sheet 51 tends to become electrostatically charged when it is unwound from the supply roll 51. The charged sheet 51 actively attracts particles and droplets because of the charge. Of course, the plastic sheet 51 may be additionally charged, or the charge neutralized, with an auxiliary electrostatic charger (not shown). Also, note that intercepted material is trapped on the sheet 51 as it is rolled upon the take-up roll 55.

Figure 3:
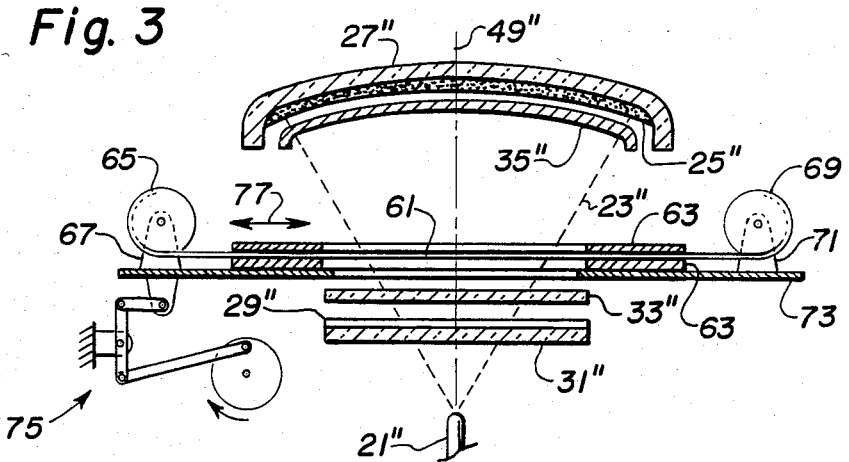
FIG. 3 is a schematic sectional elevational view of portions of a third exposure lighthouse employing a stretched sheet clamped in an oscillating frame according to a third embodiment of the novel method.

A third embodiment of the novel method is described with respect to the third exposure lighthouse shown in FIG. 3. Except for the means for intercepting extraneous material, the structure is identical to the first exposure lighthouse, and similar reference numerals are used. Instead of an auxiliary glass plate and means for moving that plate shown in FIG. 1, FIG. 3 shows a sheet 61 of clear transparent plastic, such as a polyester, as in the second embodiment, clamped in a frame 63 and positioned above and closely spaced from the upper surface of the lens 33". The sheet 61 is unwound from a supply roll 65 on a supply-roll mounting 67 and is rewound on a take-up roll 69 on a take-up-roll mounting 71. Each of the frame 63, the supply-roll mounting 67 and the take-up-roll mounting 71 is supported on a common slidable frame 73. The frame 73 is slidable in a direction that is substantially transverse to the upwardly-passing light field 23". The frame 73 is moved by a mechanical means 75 which produces an oscillatory, back-and-forth motion as indicated by the arrow 77, at least while the coating 25" is being exposed to the light field. The third embodiment combines the advantages of the oscillatory motion of the first embodiment with the use of a plastic sheet as in the second embodiment.

Except for the means for intercepting extraneous material and the means for moving the intercepting means, the novel method and the equipment for practicing the novel method are adequately described elsewhere in the patent literature, so a detailed description with the many obvious variations thereof need not be described herein. For the purposes of exemplifying the novel method, the exposure lighthouse described in U.S. Pat. No. 3,592,112 to H. R. Frey may be used in the foregoing embodiments.

Many obvious variations can be made in that lighthouse by a person of ordinary skill in the art without departing from the spirit of the novel method. For example, other light sources, lenses, filters and photosensitive layers can be used. Also, the positions of the lens and the filter may be changed, and may be reversed with respect to one another. The embodiments shown in FIGS. 1, 2 and 3 have nominal center lines 49, 49' and 49" respectively. Each of these center lines may coincide with true vertical (the direction of the force of gravity) or may be tilted from true vertical by a small acute angle up to about 15°.

The intercepting sheet may be rigid and self-supporting as exemplified by glass or acrylic sheets. Alternatively, the intercepting sheet may be pliable and not self supporting, in which cases support must be provided. Support for a pliable sheet can be provided by stretching the sheet as shown in FIG. 2 or stretching and clamping the sheet in a frame, as shown in FIG. 3. A pliable sheet may be supported entirely or partially with slightly higher gas pressure below the sheet than above the sheet. The intercepting sheet (a) should be transparent to the spectral range of the light that is of interest, (b) should be optically neutral and (c) should be structurally independent of all of the optical elements. The intercepting sheet is preferably as thin as practical so as to produce less optical scattering, less refraction of the light field, and so as to require less adjustment to the optical system. Although the embodiments show the intercepting sheet in planar form, it may be in other forms such as cylindrical.

What is claimed is:

1. In a method for exposing a layer of photosensitive material on a support to an image of light produced with light emitted from a light source below said layer and passed upwardly through an optical element, the additional steps for reducing the degradation of said image of light resulting from extraneous matter normally deposited on said optical element from the ambient atmosphere, said steps comprising
   (a) positioning a sheet of optically-transparent, optically-neutral material above said optical element,
   (b) and moving said positioned sheet with respect to said optical element during said exposing step in a direction having a substantial component transverse to said upwardly-passing light.

2. The method defined in claim 1 wherein said optical element has a nominal center line, and said sheet moves in a linear path that is substantially normal to said center line.

3. The method defined in claim 1 wherein said sheet is rigid and is self supporting.

4. The method defined in claim 1 wherein said sheet is pliable and is supported in a frame.

5. The method defined in claim 4 wherein said sheet is stretched and clamped in a frame, and said frame is moved independently of said optical element.

6. In the manufacture of a viewing screen for use in a multicolor cathode-ray tube including the step of exposing a layer of photosensitive material on the inner surface of the viewing window of said cathode-ray tube to an image of light produced with light emitted from a light source below said layer and passed upwardly through an optical element and a photograph master incident upon said layer, the improvement for reducing the degradation of said light image resulting from extraneous matter normally depositing on said optical element from the ambient atmosphere comprising
   (a) intercepting said matter on a sheet of optically-transparent material interposed between said optical element and said layer and closely spaced above said optical element, said sheet being optically neutral and physically separate from all optical elements in the path of said light,
   and
   (b) moving said sheet with respect to said optical element during said exposing step in a direction transverse to said upwardly-moving light.

7. The method defined in claim 6 wherein said sheet is moved linearly in one direction.

8. The method defined in claim 6 wherein said sheet is moved back and forth.

9. The method defined in claim 6 wherein said sheet is oscillated continuously in a linear direction substantially parallel to the surface of said optical element.

10. The method defined in claim 6 wherein said sheet is of glass.

11. The method defined in claim 6 wherein said sheet is of a disposable polymeric material.

* * * * *